(12) United States Patent
Winograd et al.

(10) Patent No.: US 7,400,520 B2
(45) Date of Patent: Jul. 15, 2008

(54) LOW-POWER CAM (75) Inventors: Gil I. Winograd, Aliso Viejo, CA (US); Esin Terzioglu, Aliso Viejo, CA (US); Morteza Cyrus Afghahi, Coto De Caza, CA (US)

(73) Assignee: Norvelics, LLC, Aliso Viejo, CA (US)

( * ) Notice: Subject to any disclaimer, the term of this patent is extended or adjusted under 35 U.S.C. 154(b) by 105 days.

(21) Appl. No.: 11/431,439

(22) Filed: May 10, 2006

(65) Prior Publication Data
US 2007/0165435 A1 Jul. 19, 2007

Related U.S. Application Data (60) Provisional application No. 60/760,255, filed on Jan. 19, 2006.

(51) Int. Cl.
*G11C 15/00* (2006.01)
(52) U.S. Cl. .................. 365/49.11; 365/49.17; 711/108
(58) Field of Classification Search .................. 365/49, 365/154, 189.07; 711/108
See application file for complete search history.

(56) References Cited

U.S. PATENT DOCUMENTS

| | | | |
|---|---|---|---|
| 6,191,970 B1 * | 2/2001 | Pereira | 365/49 |
| 6,243,280 B1 * | 6/2001 | Wong et al. | 365/49 |
| 6,768,659 B2 * | 7/2004 | Gillingham et al. | 365/49 |
| 6,903,953 B2 | 6/2005 | Khanna | |
| 6,967,856 B1 | 11/2005 | Park et al. | |
| 7,006,368 B2 | 2/2006 | Arsovski et al. | |
| 7,113,415 B1 * | 9/2006 | Khanna | 365/49 |

OTHER PUBLICATIONS

K. Pagiamtzis and A. Sheikholeslami, "A Low-Powr Content-Addressable Memory (CAM) Using Pipelined Hierarchical Search Scheme," IEEE Journal of Solid-State Circuits, vol. 39, No. 9 Sep. 2004, pp. 1512-1519.*

* cited by examiner

*Primary Examiner*—Richard T. Elms
*Assistant Examiner*—Harry W Byrne
(74) *Attorney, Agent, or Firm*—Jonathan W. Hallman; MacPherson Kwok Chen & Heid LLP (57) ABSTRACT

In one embodiment, a CAM is provided that includes; a plurality of memory cells grouped to store a word, wherein the memory cells are organized into a plurality of ripple groups, each ripple group including a complex logic gate configured to determine whether a stored content for the ripple group's memory cells matches a corresponding portion of a comparand word if an enable input for the ripple group is asserted, each complex logic gate asserting an output if the determination indicates a match, the ripple groups being arranged from a first ripple group to a last ripple group such that the output from the first ripple group's complex logic gate functions as the enable input for a second ripple group's complex logic gate and so on such that an output from a next-to-last ripple group's complex logic gate functions as the enable input for the last ripple group's complex logic gate.

7 Claims, 8 Drawing Sheets

LOW-POWER CAM

RELATED APPLICATION

This application claims the benefit of U.S. Provisional Application No. 60/760,255, filed Jan. 19, 2006.

TECHNICAL FIELD

This application relates to content address memory (CAM), and more particularly to a CAM adapted for low-power consumption.

BACKGROUND OF THE INVENTION

In conventional memories such as a random access memory (RAM) or a read only memory (ROM), data is stored at particular locations denoted as addresses. To retrieve data, a user specifies the associated address. For high-speed searches, such an approach creates a bottleneck in that the addresses are examined sequentially before the desired data can be retrieved. As a result, content addressable memory (CAM) was developed that operates in an opposite fashion to conventional memories. In other words, a user provides data to a CAM, which returns the associated address. Just like RAM/ROM, data storage in a CAM is organized into words. The word size is arbitrary. For example, a CAM may be organized to store 4-byte words (the length of each word typically denoted as the "width" of the corresponding CAM). Similarly, the number of words in any given CAM is also arbitrary (the number of words typically denoted as the "depth" of the corresponding CAM). A user thus presents a word to a CAM, which then compares the presented word simultaneously to all its stored words.

This simultaneous comparison across all stored words in CAM results in a search time that is much faster than comparable RAM/ROM operation. The results of the simultaneous comparison at each stored word in a CAM are typically expressed in the voltage of corresponding "match" lines. Each stored word may have its own corresponding match line. Prior to the comparison, each match line is typically charged to the CAM's internal supply voltage, VDD. If the presented word (typically denoted as the "comparand" word) does not match the stored word, the corresponding match line is discharged to ground. Thus, the vast majority of match lines are discharged in a typical CAM search. These match lines may be denoted as "unmatched" match lines. Although the parallel search across all stored words is thus speedy, a problem is presented because of the charge being wasted as each unmatched match line is discharged. Moreover, if the word size is increased, the capacitance (and hence stored charge) of each match line increases. Thus, a relatively large amount of power may be wasted in conventional CAM designs.

Power consumption is not the only problem with conventional CAM design. Because the capacitance of each match line can be relatively large, the amount of time it takes to pull each unmatched match line to ground can be relatively long. Thus, the speed advantage of CAM searches would be hampered if a "full-swing" (VDD or ground) decision as to the state (matched or unmatched) of each match line is made. Thus, conventional CAMs typically employ sophisticated sense amplifiers that do not need a full voltage swing to make a match decision. For example, such a sense amplifier may declare a match line to be unmatched if it senses that the voltage has dropped some fraction (e.g., 200 to 300 millivolts) below VDD. Such sensitive limited-swing (less than full swing) sense amplifiers are unreliable compared to a full-swing sense amplifiers because of their reduced margin for error. In addition, limited-swing sense amplifiers demand considerably more power.

Accordingly, there is a need in the art for improved CAM architectures that provide more power-efficient searches while demanding less die area.

SUMMARY

This section summarizes some features of the invention. Other features are described in the subsequent sections.

In accordance with an embodiment of the invention, a CAM is provided that includes a plurality of memory cells grouped to store a word, wherein the memory cells are organized into a plurality of ripple groups, each ripple group including a complex logic gate configured to determine whether a stored content for the ripple group's memory cells matches a corresponding portion of a comparand word if an enable input for the ripple group is asserted, each complex logic gate asserting an output if the determination indicates a match, the ripple groups being arranged from a first ripple group to a last ripple group such that the output from the first ripple group's complex logic gate functions as the enable input for a second ripple group's complex logic gate and so on such that an output from a next-to-last ripple group's complex logic gate functions as the enable input for the last ripple group's complex logic gate.

In accordance with another aspect of the invention, a CAM memory cell is provided that includes: an SRAM cell adapted to store a bit; a data line adapted to provide a corresponding comparand bit; an XOR gate adapted to XOR the stored bit and the comparand bit to provide an XOR output, and a switch adapted to close in response to the XOR output.

In accordance with another aspect of the invention, a CAM is provided that includes a plurality of memory cells arranged into ripple groups from a first ripple group to a last ripple group, each ripple group having an output node, the first ripple group being adapted to assert its output node if a content of its memory cells match a corresponding portion of a comparand word, each ripple group subsequent to the first ripple group being adapted to assert its output node only if both a content of its memory cells match a corresponding portion of the comparand word and the preceding ripple group has asserted its output node.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

As described previously, conventional CAM searches are speedy but waste power. To address the need in the art for improved power consumption in CAMs, a CAM is disclosed that employs a "ripple" search across each stored word. In exemplary embodiments, each stored word is arranged into groups of bits, which may be denoted as "ripple groups." A given ripple group will compare its contents to the corresponding comparand bits only if the preceding ripple group has declared a match. In this fashion, a match will ripple across the ripple groups. The default state of each ripple group output (match node) is a mismatch. Because a given ripple group will not compare its contents unless the preceding ripple group has declared a match, considerable power savings are obtained over conventional CAM architectures. Moreover, because the default output is a mismatch, the disclosed CAMs may efficiently be used in applications such as, for example, triggering a wordline in an output table lookup.

Figure 1:
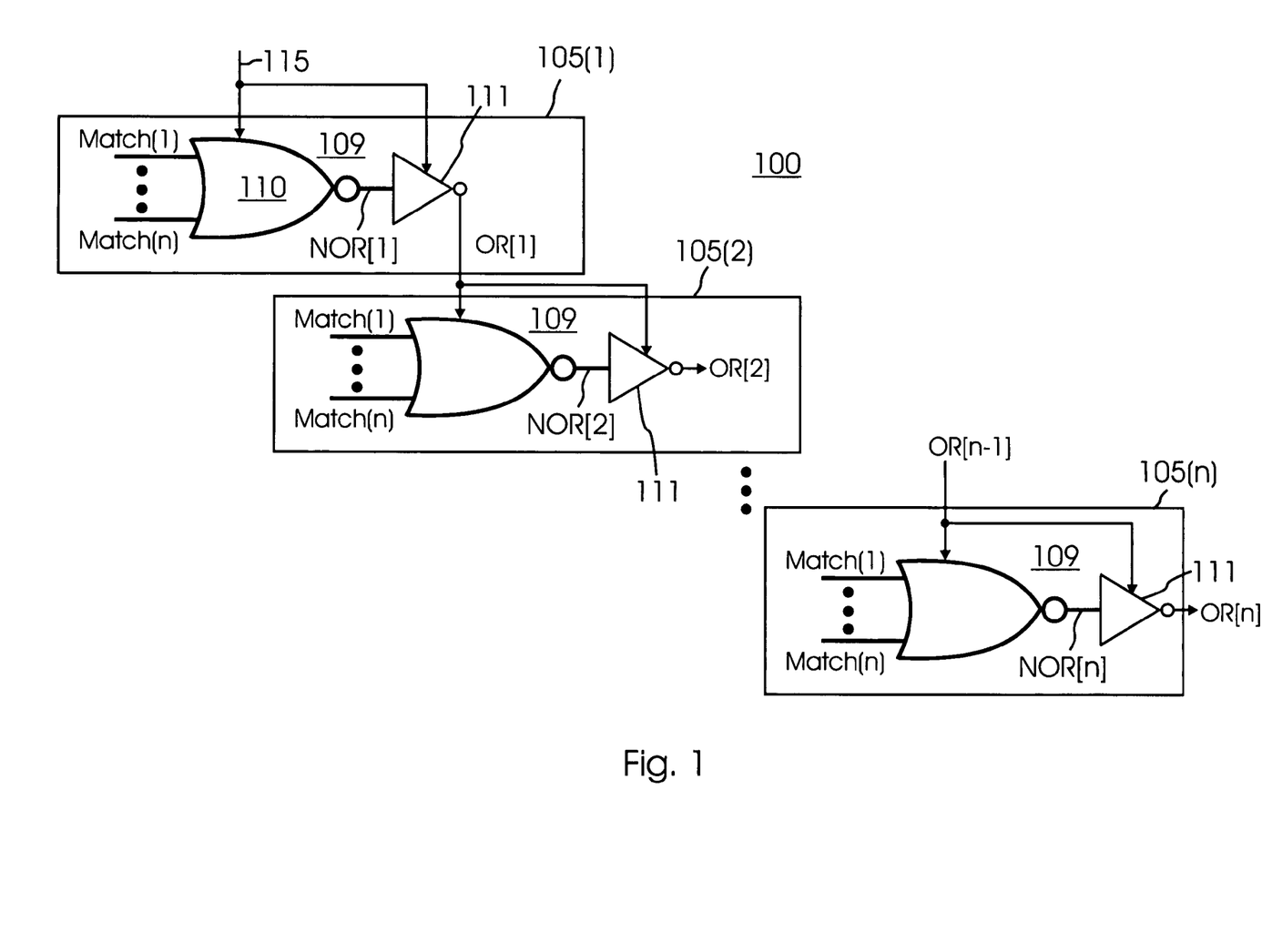
FIG. 1 is a high-level conceptual diagram of a CAM in accordance with an embodiment of the invention.

Turning now to FIG. 1, a conceptual diagram of an improved CAM architecture 100 is illustrated. In this architecture, each stored word in the CAM is stored across a plurality of "ripple groups" 105 arranged in sequence. For illustration clarity, the ripple groups for just one stored word are illustrated, the remaining stored words being analogous. Each ripple group includes a complex logic gate 109 having an enable input. Each complex logic gate may function as an OR gate if its enable input is asserted. Because the first ripple group 105[1] has no preceding ripple group, its enable input is a control signal 115. The remaining ripple groups have their enable input controlled by an OR output of the preceding ripple group. For example, a second ripple group 105[2] receives an OR output OR[1] from the first ripple group. Similarly, a final ripple group 105[n] receives an OR output OR[n−1] from the preceding (n−1)th ripple group (not illustrated). In one embodiment, each OR gate may be implemented as a NOR gate 110 followed by an inverter 111. If an enable input is true, then the corresponding complex logic gate functions as a NOR gate/inverter combination with respect to its remaining input signals, which are designated as matchx(1) through matchx(n). These input signals may represent the complement of a comparison between a stored bit and a corresponding comparand bit. For example, each ripple group may include a plurality of CAM memory cells (not illustrated) wherein each CAM memory cell is adapted to provide a corresponding matchx input signal to its ripple group's NOR gate. If the stored bit matches the comparand bit, the matchx input signal is false. Conversely, if the stored bit mismatches the comparand bit, the matchx input signal is true. Both the number of CAM memory cells per ripple group and the total number of ripples groups may be varied to suit individual design needs. For example, suppose the CAM word size is 128 bits. In such an embodiment, each 128-bit word may be distributed across eight ripple groups storing 16 bits each.

Each ripple group's NOR gate will only be enabled if the previous ripple group has declared a match. Thus, if any preceding ripple group to a given ripple group has a mismatch (the NOR output being false), the given ripple group's NOR gate will not be enabled such that its output cannot change state. In contrast, a prior art CAM match line may be thought of as the collection of all the NOR output nodes in CAM 100. In this prior art CAM, (assuming there is not a match for a given stored word) these output nodes are all pulled to ground after being charged to VDD, thereby wasting charge.

Figure 2:
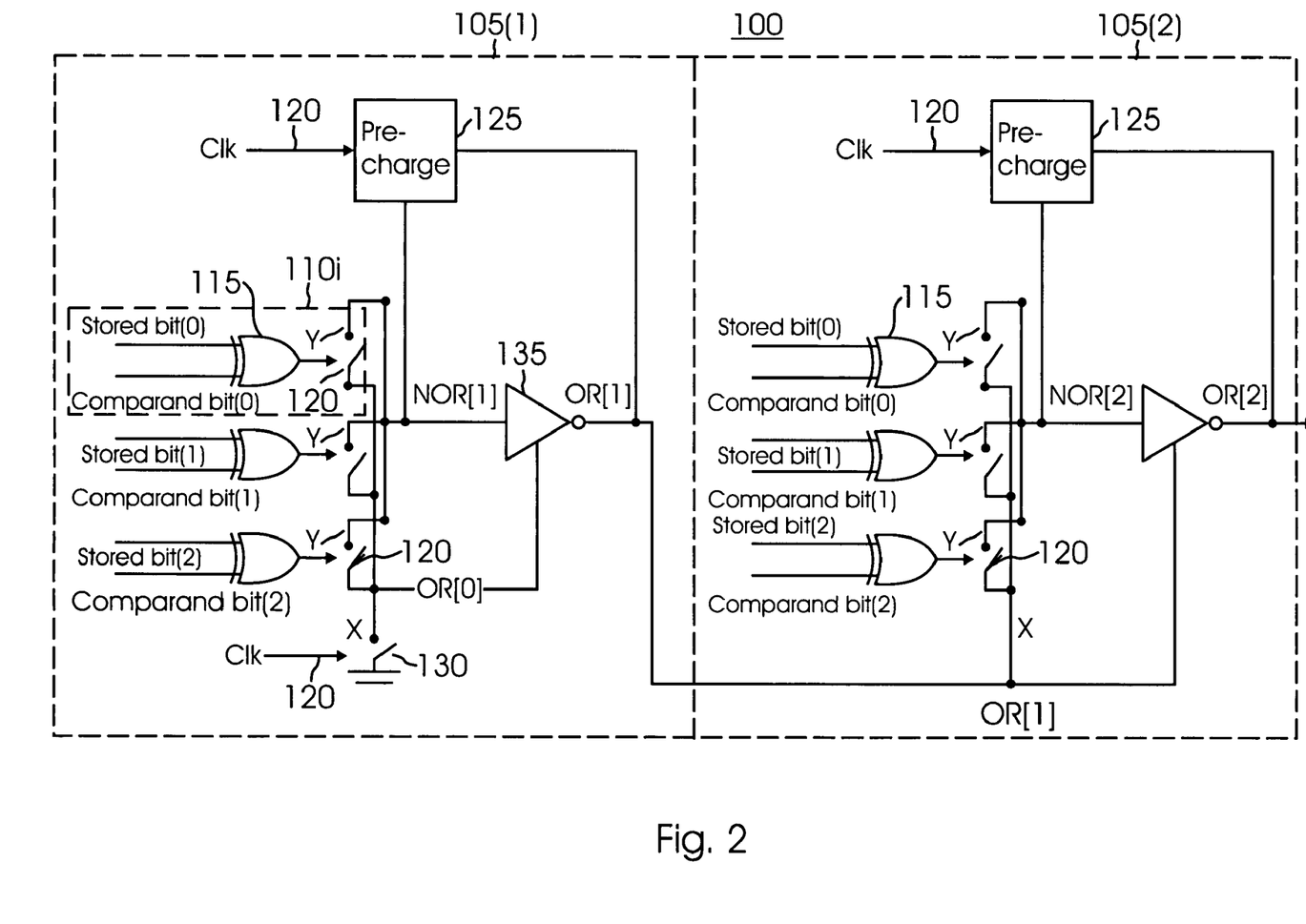
FIG. 2 is a more detailed diagram of the first and second ripple groups in the CAM of FIG. 1.

Operation of CAM 100 may be better understood through discussion of FIG. 2, which provides a more detailed view of ripple groups 105[1] and 105[2]. For illustration clarity, only a first ripple group 105[1] and a second ripple group 105[2] are shown. Each ripple group includes a plurality of CAM memory cells 110. For example, an ith memory cell 110i is shown for first ripple group 105[1]. Each CAM memory cell compares its stored bit to the corresponding comparand bit using, for example, an XOR gate 115 to provide an XOR output. These XOR outputs are true if the corresponding stored bit and comparand bit do not match. As used herein, a signal is said to be "asserted" if that signal is logically true, regardless of whether the signal is active high or active low. Similarly, a signal is denoted as "de-asserted" if that signal is logically false, regardless of whether the signal is active high or active low.

If the corresponding stored bit and the comparand bit match, the XOR output is false. The logical state of the XOR outputs may control the logical state of an OR node and a NOR node in each ripple group as follows. Prior to a ripple operation, the OR and NOR nodes are pre-charged to a power supply voltage VDD. For example, in the first ripple group 105[1], a pre-charge circuit 125 controlled by a clock 120 charges a node OR[1] and a node NOR[1] to VDD. In one embodiment, the pre-charge occurs while the clock is low (subsequent to the falling edge). Subsequent to the clock rising edge, the pre-charge circuitry allows these nodes to float.

Prior to the clock rising edge, all the XOR gates have performed their comparison. Responsive to this comparison, each XOR output controls a corresponding switch 120 coupled between nodes x and y. It may thus be seen that if the stored bit and the comparand bit have the same binary state, the corresponding switch will remain open. However, if the bits do not match, the switch closes to couple an "OR" node from the preceding ripple group to the ripple group's NOR node. To begin the ripple operation, an OR[0] node is discharged to ground through a switch 130 controlled by the clock. Should any of the stored bits in the first ripple group not match the corresponding comparand bit, the corresponding switch 120 will close, thereby grounding node NOR[1]. Each NOR node thus functions as the logical NOR of its ripple group's XOR outputs. For example, node NOR[1] functions as a logical NOR of the XOR outputs in the first ripple group. Within each ripple group, an inverter 135 drives an OR node in response to receiving the NOR output. For example, in the first ripple group node OR[1] is the complement of node NOR[1]. The ground for each inverter is the preceding OR node. For example, in ripple group 105[1], the inverter's ground is the OR[0] node.

If OR[1] is false (thereby pulled low in an active high system) so as to indicate a match for all bits in the first ripple group, switches 120 in the subsequent ripple group 105[2] may affect node NOR[2]. It may thus be seen that the OR input to a given ripple group acts as the enable input signal discussed with regard to FIG. 1. If an OR input remains at VDD because of a mismatch in a preceding ripple group, a given ripple group's NOR node remains charged to VDD. It will be appreciated that before a ripple operation takes place, the CAM memory cell should have performed its comparison operation such that their XOR outputs are either true or false.

Note the advantages of such a ripple operation—should the first ripple group include one or more stored bits that do not match the corresponding comparand bits, only node NOR[1] is discharged. Because of the mismatch, all the subsequent NOR nodes remain charged. Conversely, if all the bits match in the first ripple group, the ripple operation "ripples" to the second ripple group (the subsequent ripple group). It may thus be generalized that for the ith ripple group, its NOR node can only be discharged if all the preceding ripple groups' stored bits match the corresponding comparand bits. Moreover, because the OR output from the last ripple group (FIG. 1) is default high, this OR output may be used directly to drive a wordline in an output memory (not illustrated). In this fashion, high speed operation is enabled.

Figure 3:
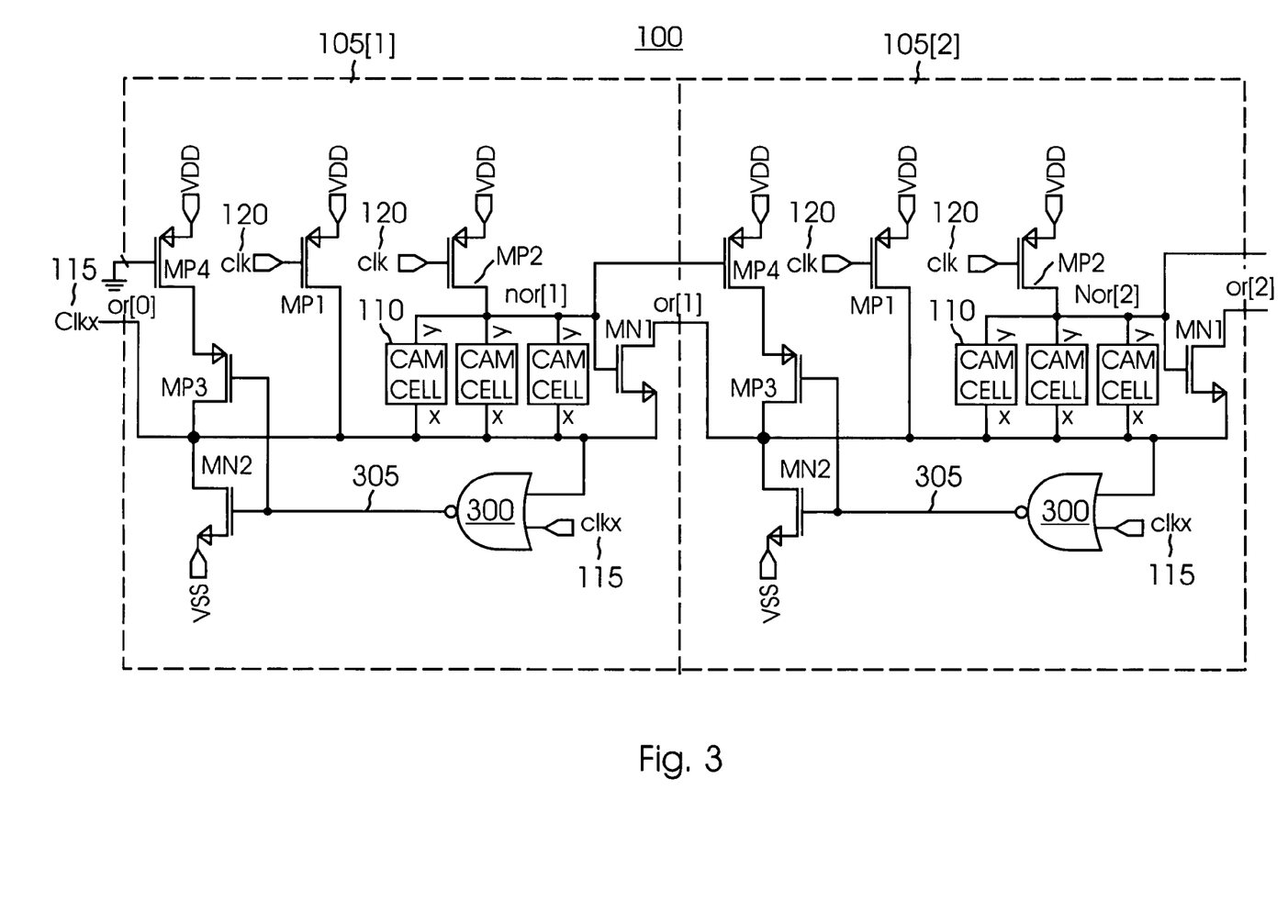
FIG. 3 is a circuit diagram of first and second ripples groups of FIG. 2 according to an embodiment of the invention.

The ripple groups may be implemented in numerous alternative embodiments. For example, a first ripple group implementation is illustrated in FIG. 3. Each ripple group 105 includes a plurality of CAM memory cells 110 coupled between node labeled "x" and a node labeled "y." These x and y nodes correspond to those indicated in FIG. 2. As discussed with regard to FIG. 2, each CAM memory cell may function as an XOR of its stored bit and the corresponding comparand bit. If the XOR indicates a mismatch (the XOR result being true), the CAM memory cell connects node x to node y. Conversely, if the XOR result indicates a match (the XOR result being false), the CAM memory cell isolates node x from node y. The y nodes tie to the NOR nodes. Thus, in a first ripple group 105[1], a node NOR[1] ties to the y nodes of its CAM memory cells. Similarly, in a second ripple group 105[2], a node NOR[2] ties to the y nodes of this ripple group's CAM memory cells, and so on.

The ripple comparison of the word stored in the CAM memory cells across all the ripple groups to the comparand word is triggered by a clock 120. For example, CAM 100 may be responsive to the rising edge of clock 120. However, it will be appreciated that other embodiments could be responsive to the clock falling edge. The first ripple group 105[1] has a node OR[0] tied to the complement of the clock, clkx 115. Thus, prior to the rising edge of clock 120, node OR[0] is charged to VDD. However, after a rising edge of clock 120, node OR[0] is pulled low.

To perform the pre-charge of the OR nodes, each ripple group may include a PMOS transistor MP1 having its drain tied to the corresponding OR node and its source tied to a power supply node VDD. The gate of MP1 is driven by the clock such that prior to the clock rising edge, MP1 conducts so as to charge the OR node to VDD. The OR node in each ripple group functions as the logical complement of the NOR node in the same ripple group. For example, node OR[2] in second ripple group 105[2] functions as the complement of node NOR[2]. This inversion may occur by tying a ripple group's NOR node to a gate of an NMOS transistor MN1. If a NOR node is high, then MN1 is conducting, which brings the corresponding OR node low as follows. Referring back to FIG. 2, it may be seen (in the case of a match) that all the OR nodes of all the ripple groups would have to be pulled to ground through switch 130. To provide a more local and direct path to ground, each ripple group may include a NOR gate 300 that receives the clock complement clkx and the preceding ripple group's OR output. Subsequent to a clock rising edge (clkx being low), should the preceding OR output be pulled low, an output 305 of NOR gate 300 will go high. Output 305 controls the gate of an NMOS transistor MN2. Thus, if the preceding OR node is low and transistor MN1 conducting (indicating a match in the corresponding ripple group), a path is provided to drain a given ripple group's OR node to ground. Conversely, should output 305 be high, this output functions to maintain the preceding OR node high by controlling a gate of a PMOS transistor MP3 stacked in series with a PMOS transistor MP4 between a power supply node VDD and the preceding OR node. The gate of transistor MP4 is controlled by the preceding ripple group's NOR output. Transistor MP4 is the complement to MN1 in that if a ripple group's NOR node is low, MP4 conducts so that the power supply voltage VDD is applied to the source of transistor MP3. In turn, because MP3 will be conducting, the ripple's group OR node will be maintained at VDD (in contrast to the ripple group's NOR node, which is grounded).

The pre-charging of the NOR nodes occurs analogously to the pre-charging of the OR nodes. For example, each NOR node may tie to the drain of a PMOS transistor MP2 whose source ties to the power supply node VDD. The clock drives the gate of MP2 such that MP2 conducts prior to the clock rising edge, thereby charging the corresponding NOR node to VDD.

Figure 4:
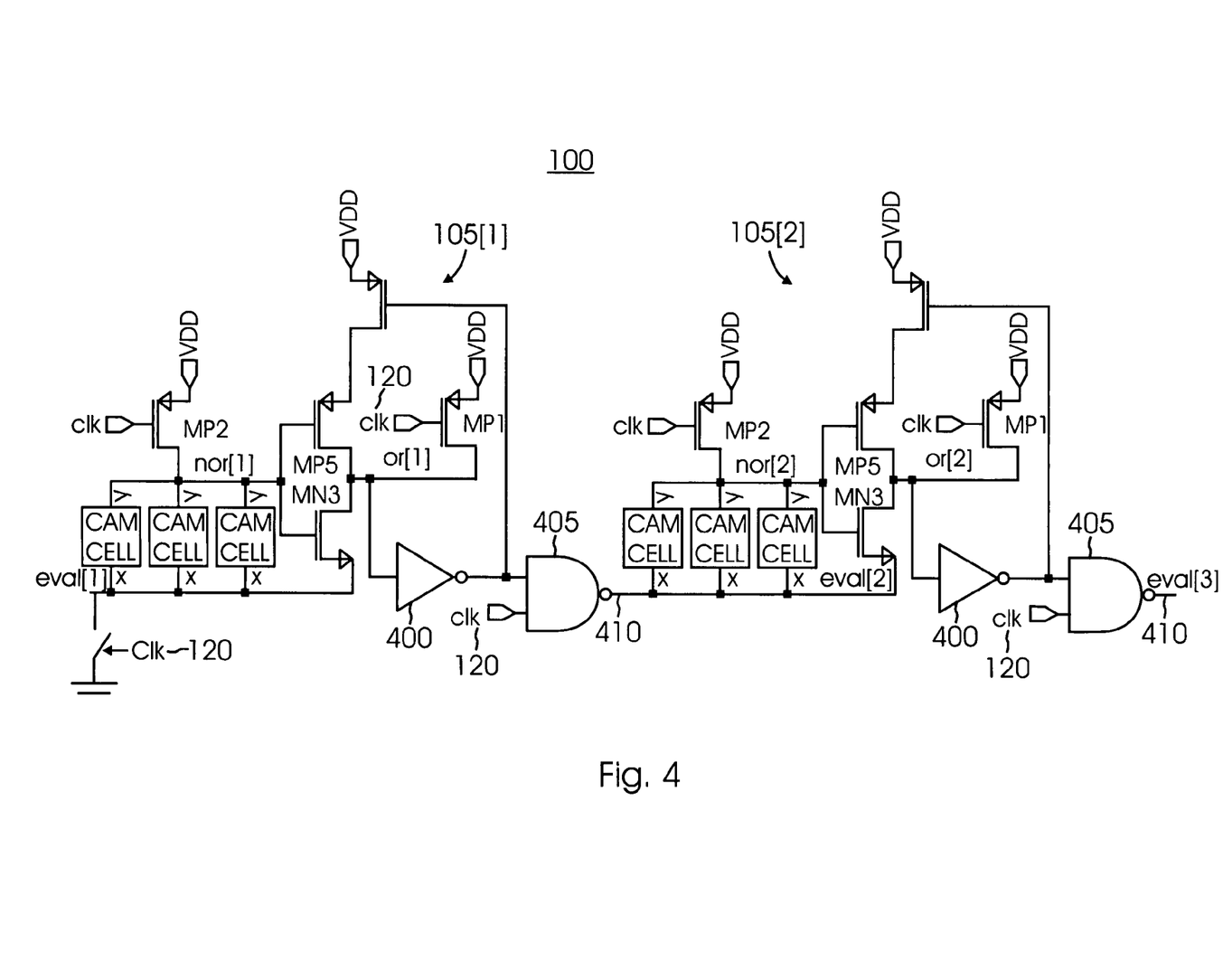
FIG. 4 is a circuit diagram of first and second ripples groups of FIG. 2 according to an embodiment of the invention.

An alternative ripple group embodiment is illustrated in FIG. 4. In this embodiment, a ripple group's memory cells have their x nodes isolated from the preceding ripple group's OR node by an inverter 400 and a NAND gate 405. For example, should all the bits match in the first ripple group 105[1], node OR[1] will be low during a ripple operation (after the rising edge of clock 120). Inverter 400 inverts this value and provides a true input to NAND gate 405. NAND gate 405 also receives clock 120, which is high during the ripple operation. Thus, an output 410 of NAND gate 405 will be low in response to these conditions. Output 410 is tied to an "eval" node of the corresponding ripple gate. For example, in the second ripple group 105[2], output 410 is tied to a node eval[2]. The eval node acts as the "x" inputs to each of the memory cells. It follows that if the clock is high and the preceding ripple group's OR output is low for a given ripple group, the given ripple group's x inputs are also low. In this fashion, a NOR node may be pulled to ground during a ripple operation producing a match as discussed previously. Each NOR node controls the gate of a series-connected PMOS transistor MP5 and an NMOS transistor MN3. If a NOR node is high (indicating a match for the corresponding ripple group's stored bits), it will drive the corresponding transistor MN3 to conduct so that the corresponding OR node is drained to ground. Conversely, if a NOR node is low (indicating a mismatch for the corresponding ripple group's stored bits), it will drive the corresponding transistor MP5 to conduct so that the corresponding OR node is maintained at VDD. Transistors MP1 and MP2 function as described with regard to FIG. 3 to precharge the OR and NOR nodes. A local path to ground for the OR node of each ripple group is provided through inverter 400.

If a NOR node is pulled low, it will drive the corresponding transistor MP5 to conduct, thereby maintaining the corresponding OR node to remain high. In this fashion, the complement relationship between corresponding NOR/OR nodes is maintained.

Figure 5:
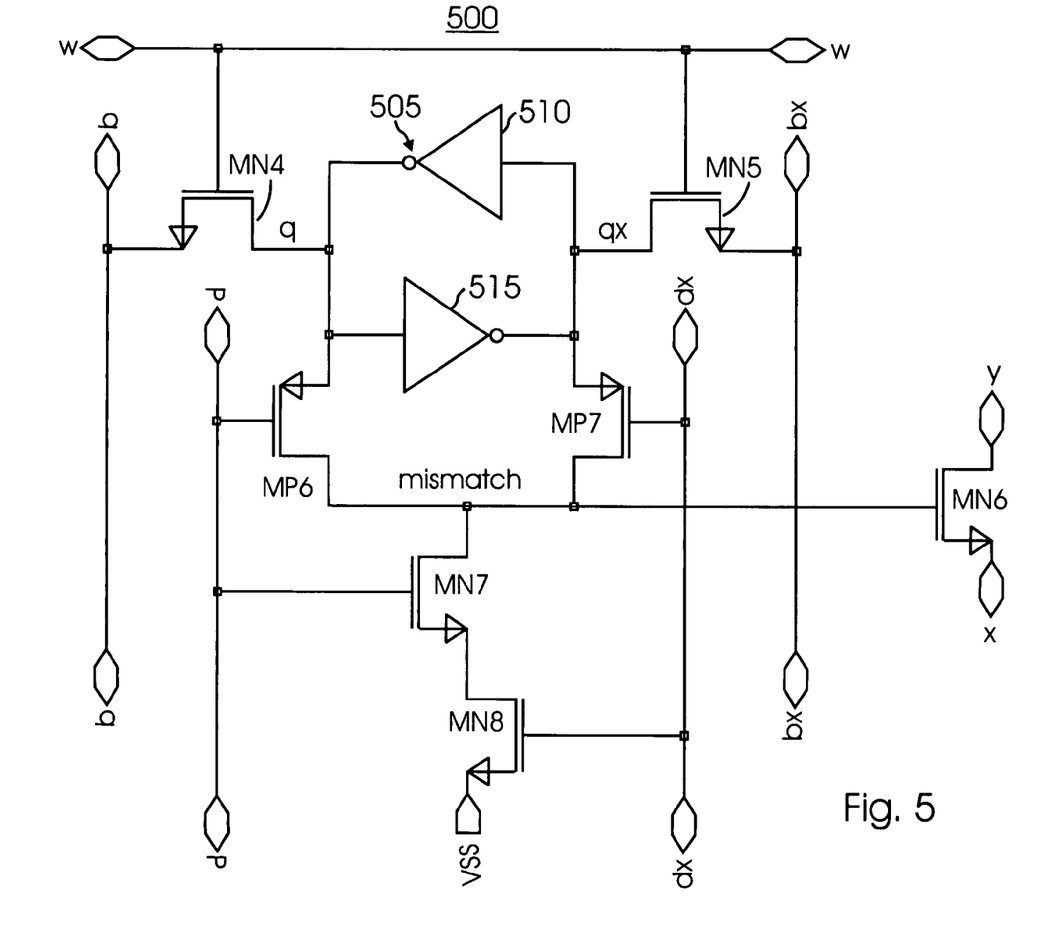
FIG. 5 is a circuit diagram of a CAM memory cell without a masking bit in accordance with an embodiment of the invention.

Given this ripple group architecture, embodiments of CAM memory cells that function to provide the XOR gate output discussed with regard to FIG. 2 will now be discussed. A first memory cell embodiment 500 is illustrated in FIG. 5. Cell 500 includes a conventional 6-T static random access memory (SRAM) cell 505 represented by cross-coupled inverters 510 and 515. A word line w drives an NMOS transistor MN4 to couple a "q" node to a bit line b. Similarly, word line 520 drives an NMOS transistor MN5 to couple a "qx" node to a bit complement line bx. The comparand bit is carried on a data line d and in complement form on a complement data line dx.

Data line d drives a gate of a PMOS transistor MP6. Similarly, data line dx drives a gate of a PMOS transistor MP7. The comparison operation occurs as follows. Suppose the data line is high whereas the q node is low (indicating a mismatch). In such a case, MP7 will conduct the high value at node qx to a common drain node (denoted as "mismatch" node) between transistors MP6 and MP7. This active high mismatch node drives a gate of an NMOS transistor MN6 coupled between nodes x and y. In this fashion, node x will couple to node y in response to this mismatch. An analogous operation occurs for the complement mismatch (node q being high while data line d is low). Prior to a comparison operation, lines d and dx are pre-charged to VDD. Because these lines control the gates of NMOS transistors MN7 and MN8, the mismatch node is pulled to ground. This grounded state does not change if, however, the stored bit in the SRAM cell and the comparand bit match. For example, suppose d and q are both high such that qx and dx are both low. Neither transistors MP6 or MP7 are conducting in such a case. A similar operation occurs if both q and d are low. It will be appreciated that, rather than have separate bit and data lines, the bit lines may also function as the data lines. Each embodiment has its own advantages. For example, if the bit lines also function as data lines, routing overhead is reduced. However, if the bit lines and the data lines are separated, capacitive loading is reduced. As yet another alternative embodiment, transistors MN7 and MN8 may be eliminated. However, the mismatch node reliability may then be affected.

Figure 6:
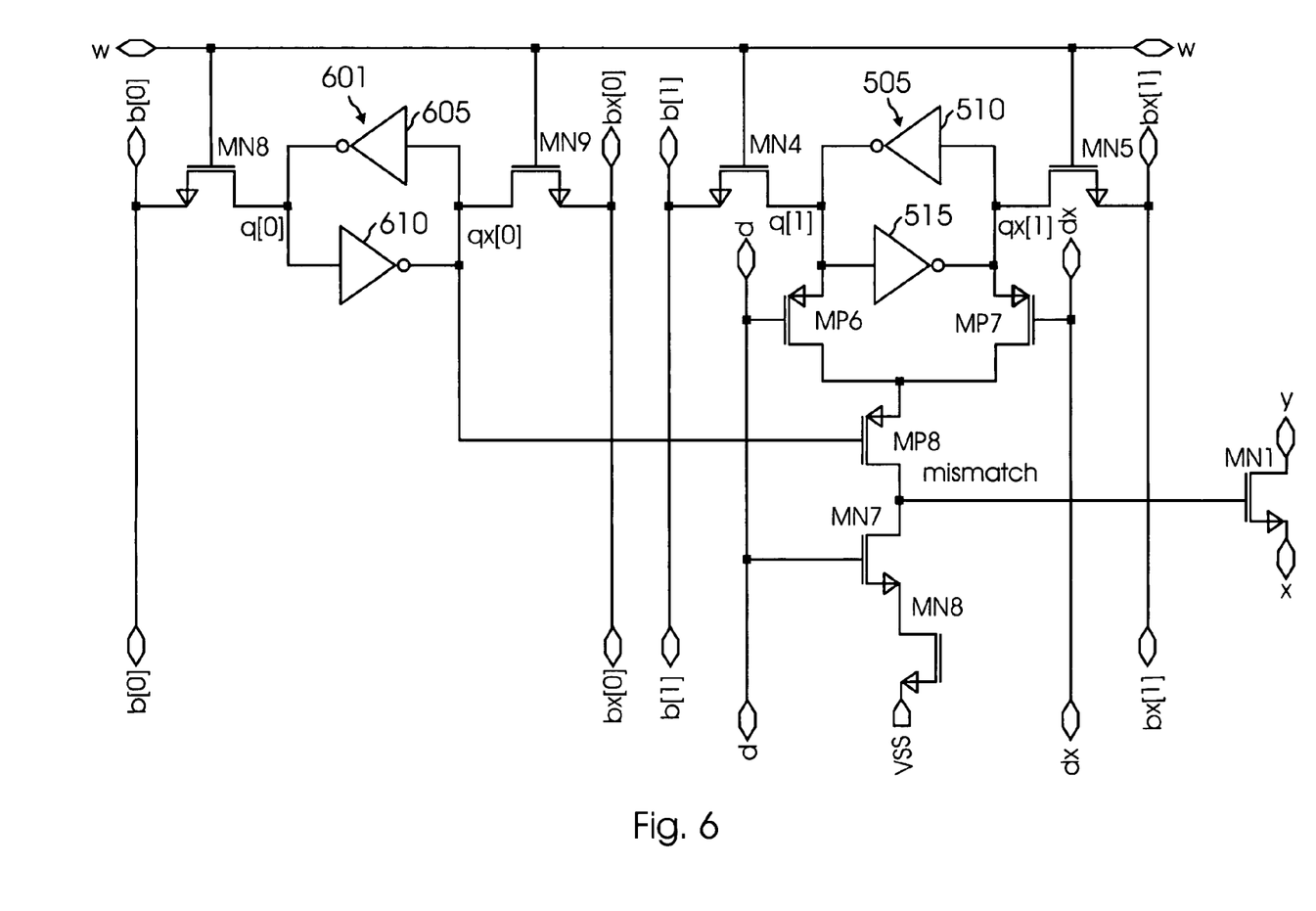
FIG. 6 is a circuit diagram of a CAM memory cell having a masking bit in accordance with an embodiment of the invention.

Turning now to FIG. 6, a CAM memory cell 600 that provides a masking property is illustrated. SRAM cell 505 couples to the bit lines through transistors MN4 and MN5 as discussed previously. Similarly, data lines d and dx drive the gates of transistors MP6 and MP7, respectively, as also discussed with regard to FIG. 5. A masking bit is stored in an SRAM cell 601 formed using cross-coupled inverters 605 and 610. Cell 601 may be written to through bit lines b[0] and bx[0] using NMOS transistors MN8 and MN9, respectively. A complement node qx[0] of cell 601 controls a PMOS transistor MP8 coupled to the drains of transistors MP6 and MP7. Thus, if cell 601 stores a logical "1" such that qx[0] is low, transistor MP8 conducts, thereby allowing the control of the mismatch node analogously as discussed with regard to FIG. 5. Alternatively, if cell 601 stores a logical "0" such that node qx[0] is high, the mismatch node will stay low regardless of whether a match or mismatch condition exists. In this fashion, bits in a stored word may be disregarded or ignored during a comparison operation. As discussed previously, the mismatch mode may be pulled low during a pre-charge state through operation of transistors MN7 and MN8. Cell 600 may be modified into alternative embodiments as discussed with respect to FIG. 5.

Figure 7:
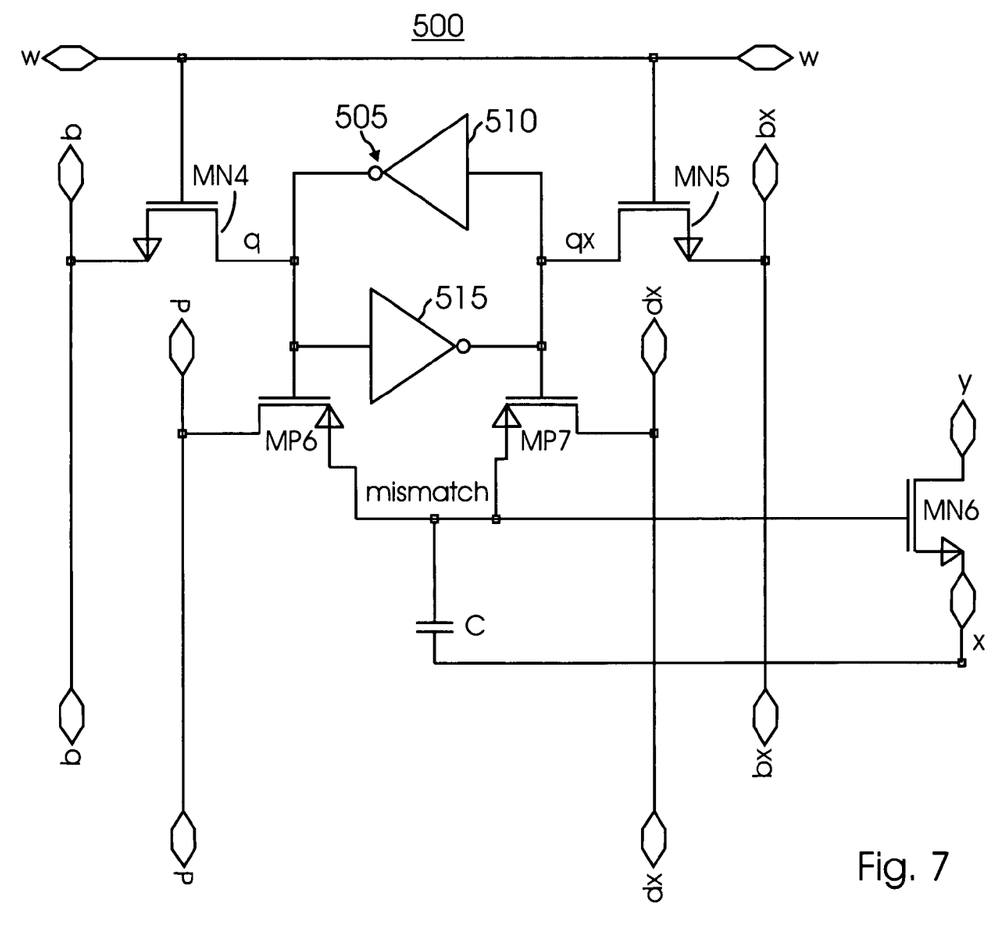
FIG. 7 is a circuit diagram of a CAM memory cell without a masking bit in accordance with an embodiment of the invention.

Turning now to FIG. 7, a CAM memory cell 700 is illustrated that uses fewer transistors than cell 500. In addition, the data lines d and dx receive less capacitive loading. Moreover, cell 700 uses less power. Cell 700 includes a memory cell 505 formed using cross-coupled inverters 510 and 515 as discussed with regard to cell 500. In addition, cell 700 includes transistors NN4 and MN5 coupled between the memory cell and the bit and word lines as also discussed with regard to cell 500. However, nodes q and qx drive the gates of PMOS transistors MP6 and MP7, respectively. A first terminal for transistors MP6 and MP7 couple to data lines d and dx, respectively. A second terminal for transistors MP6 and MP7 both couple to the mismatch node. Prior to a comparison operation, data lines d and dx are discharged to ground. Because one of MP6 or MP7 will be on depending upon the values of q and qx, the mismatch mode will be pulled to the corresponding PMOS threshold voltage. During the comparison operation, either d or dx becomes charged to VDD. If there is a mismatch, this high voltage will couple through either MP6 or MP7 to charge the mismatch node high. However, if there is no mismatch, the mismatch node will stay at the threshold voltage. Because this threshold voltage (due to design mismatches or other uncertainties) may be too high so as to allow MN6 to conduct slightly despite a match condition, the x node may be coupled to the mismatch node through a capacitor C. Thus, when the x node is pulled low, the mismatch node will also be pulled slightly lower, thereby ensuring that that MN6 does not conduct significantly during a match condition. The capacitor may be implemented using an NMOS transistor or a metal layer capacitor.

Figure 8:
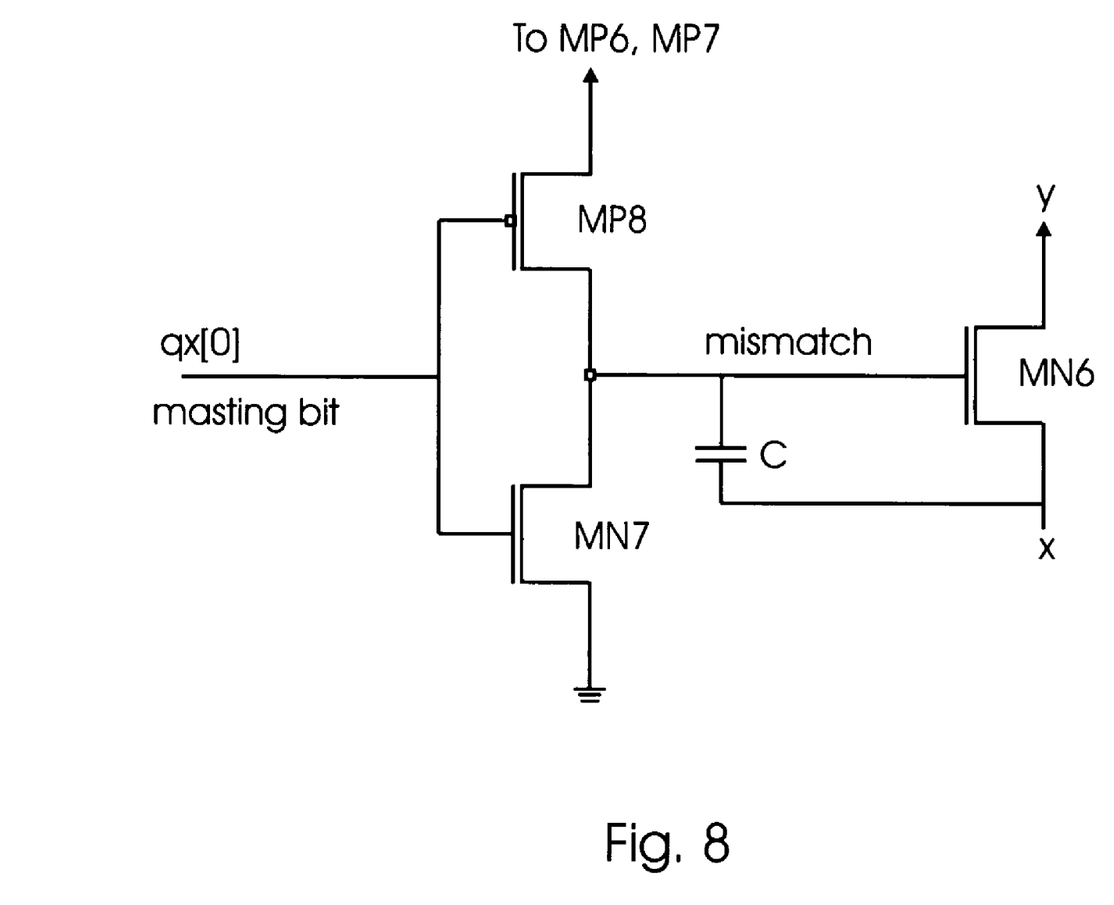
FIG. 8 illustrates a portion of the CAM memory cell of FIG. 7 modified to include a masking bit.

It will be appreciated that cell 700 may be modified analogously as discussed with regard to cell 600 to include a masking bit so as to form a ternary memory cell. However, as seen in FIG. 8, the qx[0] output of the masking bit memory cell should drive the gates of a series-connected PMOS transistor MP8 and an NMOS transistor MN7. The common terminal between MP8 and MN7 couples to the mismatch node. Thus, if the masking memory cell (not illustrated) stores a "1" such that qx[0] is low, the comparison operation discussed with regard to FIG. 7 is enabled. Conversely, if the masking memory memory cell stores a "0" such that qx[0] is high, the comparison operation is prevented in that the mismatch node is grounded through MN7.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:
1. A CAM, comprising;
a plurality of memory cells grouped to store a word,
wherein the memory cells are organized into a plurality of ripple groups, each ripple group's memory cells being configured to assert a mismatch output if a content for the memory cell mismatches a corresponding bit of a comparand word, and wherein each ripple group includes:
a NOR gate adapted to NOR the mismatch outputs of the memory cells in its ripple group;

an inverter adapted to invert a NOR output from the NOR gate to provide an OR output representing the logical OR of the ripple group's mismatch outputs; and pre-charge circuitry for pre-charging the NOR output to a power supply voltage VDD;

wherein the ripple groups are arranged from a first ripple group to a last ripple group such that a NOR output from the second ripple group can only be discharged if all the second ripple group's mismatch outputs are false and the first ripple group's OR output is false, and so on such that a NOR output from the last ripple group can only be discharged if all the last ripple group's mismatch outputs are false and a next-to-last ripple group's OR output is false.

2. The CAM of claim 1, wherein the pre-charge circuitry is adapted to pre-charge the NOR and OR outputs responsive to cycles of a clock signal, and wherein the NOR gate is enabled in the first ripple group responsive to cycles of the clock signal.

3. The CAM of claim 1, wherein, for each ripple group, the pre-charge circuitry comprises a first PMOS transistor coupled between the NOR output and a power supply node and a second PMOS transistor coupled between the OR output and a power supply node.

4. The CAM of claim 1, wherein, for each memory cell in a given ripple group, the preceding OR gate output couples to the given ripple group's NOR output through a corresponding switch, each switch being controlled to close in response to the assertion of the memory cell's mismatch output.

5. The CAM of claim 4, wherein each switch comprises an NMOS transistor.

6. The CAM of claim 1, wherein, for each ripple group, the inverter comprises an NMOS transistor having a first terminal coupled to the ripple group's OR output and having a second terminal coupled to the preceding ripple group's OR output, the NMOS transistor having a gate controlled by the ripple group's NOR output.

7. The CAM of claim 1, wherein each ripple group includes a second NOR gate adapted to provide a path to ground for the preceding ripple group's OR output by driving a gate of an NMOS transistor having a first terminal tied to ground and a second terminal tied to the preceding ripple group's OR output.

* * * * *